(12) United States Patent
Zitzlsperger (10) Patent No.: US 10,040,230 B2
(45) Date of Patent: Aug. 7, 2018

(54) METHOD OF PRODUCING A HOUSING FOR AN ELECTRONIC DEVICE AND AN ELECTRONIC DEVICE, HOUSING FOR AN ELECTRONIC DEVICE, AND ELECTRONIC DEVICE

(71) Applicant: OSRAM Opto Semiconductors GmbH, Regensburg (DE)

(72) Inventor: Michael Zitzlsperger, Regensburg (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 15/126,071

(22) PCT Filed: Mar. 18, 2015

(86) PCT No.: PCT/EP2015/055687
§ 371 (c)(1),
(2) Date: Sep. 14, 2016

(87) PCT Pub. No.: WO2015/140213
PCT Pub. Date: Sep. 24, 2015

(65) Prior Publication Data
US 2017/0095955 A1   Apr. 6, 2017

(30) Foreign Application Priority Data

Mar. 21, 2014   (DE) .................. 10 2014 103 942

(51) Int. Cl.
*B29C 45/14*   (2006.01)
*B29C 45/02*   (2006.01)
(Continued)

(52) U.S. Cl.
CPC ........ *B29C 45/14655* (2013.01); *B29C 43/18* (2013.01); *B29C 45/02* (2013.01);
(Continued)

(58) Field of Classification Search
CPC ...... B29C 45/14655; B29C 2043/3444; H01L 23/043
See application file for complete search history.

(56) References Cited

U.S. PATENT DOCUMENTS

6,309,916 B1   10/2001  Crowley et al.
6,611,047 B2*  8/2003  Hu .................. H01L 21/565
                                         257/666
(Continued)

*Primary Examiner* — Moazzam Hossain
*Assistant Examiner* — Farun Lu
(74) *Attorney, Agent, or Firm* — DLA Piper LLP (US)

(57) ABSTRACT

A method of producing a housing for an electronic device including: in a three-dimensional molding process, a housing part assembly consisting of a plurality of contiguous plastics housing parts is produced using a plastics material; and the housing part assembly is split up into a plurality of individual plastics housing parts by a separation procedure, each one of the parts forming at least a part of a housing, wherein the molding process is transfer molding or compression molding, a mold is used for the molding process including mold pins by which first side faces molded on during the molding process are produced on each of the plastics housing parts, the separation procedure results in second side faces being produced on each of the plastics housing parts, and the first and second side faces form outer faces of the plastics housing parts.

17 Claims, 10 Drawing Sheets

(51) Int. Cl.
    *B29C 43/18*     (2006.01)
    *H01L 21/56*     (2006.01)
    *H01L 23/043*     (2006.01)
    *B29K 705/04*     (2006.01)
    *B29L 31/34*     (2006.01)

(52) U.S. Cl.
    CPC .......... *H01L 21/561* (2013.01); *H01L 21/565* (2013.01); *H01L 23/043* (2013.01); *B29C 2043/181* (2013.01); *B29K 2705/04* (2013.01); *B29L 2031/3481* (2013.01)

(56) References Cited

U.S. PATENT DOCUMENTS

| | | |
|---|---|---|
| 7,790,512 B1 | 9/2010 | Sirinorakul et al. |
| 8,240,034 B1 | 8/2012 | Hiew et al. |
| 2002/0025607 A1* | 2/2002 | Danno ................ H01L 21/561 |
| | | 438/126 |
| 2010/0001306 A1 | 1/2010 | Park et al. |
| 2011/0210354 A1* | 9/2011 | Ichikawa ............ B29C 45/0055 |
| | | 257/98 |
| 2013/0187178 A1 | 7/2013 | Tischler |

* cited by examiner

FIG 24

METHOD OF PRODUCING A HOUSING FOR AN ELECTRONIC DEVICE AND AN ELECTRONIC DEVICE, HOUSING FOR AN ELECTRONIC DEVICE, AND ELECTRONIC DEVICE

TECHNICAL FIELD

This disclosure relates to a method of producing a housing for an electronic device, a method of producing an electronic device with such a housing, a housing for an electronic device and an electronic device with such a housing.

BACKGROUND

Housings for electronic devices are often produced as an assembly, which assemblies are then split up into the individual housings. The splitting process, which conventionally proceeds along mutually orthogonal and parallel dividing lines, results in the housings typically having a rectangular basic shape, but this is not always advantageous.

It could therefore be helpful to provide a method of producing a housing for an electronic device that permits a basic housing shape deviating from a rectangular basic shape.

SUMMARY

I provide a method of producing a housing for an electronic device including, in a three-dimensional molding process, a housing part assembly consisting of a plurality of contiguous plastics housing parts is produced using a plastics material, and the housing part assembly is split up into a plurality of individual plastics housing parts by a separation procedure, each one of the parts forming at least a part of a housing, wherein the molding process is transfer molding or compression molding, a mold is used for the molding process including mold pins by which first side faces molded on during the molding process are produced on each of the plastics housing parts, the separation procedure results in second side faces being produced on each of the plastics housing parts, and the first and second side faces form outer faces of the plastics housing parts.

I also provide a method of producing an electronic device in which an electronic semiconductor chip is arranged in a housing produced using the method of producing a housing for an electronic device including, in a three-dimensional molding process, a housing part assembly consisting of a plurality of contiguous plastics housing parts is produced using a plastics material, and the housing part assembly is split up into a plurality of individual plastics housing parts by a separation procedure, each one of the parts forming at least a part of a housing, wherein the molding process is transfer molding or compression molding, a mold is used for the molding process including mold pins by which first side faces molded on during the molding process are produced on each of the plastics housing parts, the separation procedure results in second side faces being produced on each of the plastics housing parts, and the first and second side faces form outer faces of the plastics housing parts.

I further provide a housing for an electronic device produced by the method of producing a housing for an electronic device including, in a three-dimensional molding process, a housing part assembly consisting of a plurality of contiguous plastics housing parts is produced using a plastics material, and the housing part assembly is split up into a plurality of individual plastics housing parts by a separation procedure, each one of the parts forming at least a part of a housing, wherein the molding process is transfer molding or compression molding, a mold is used for the molding process including mold pins by which first side faces molded on during the molding process are produced on each of the plastics housing parts, the separation procedure results in second side faces being produced on each of the plastics housing parts, and the first and second side faces form outer faces of the plastics housing parts, including a plastics housing part with molded-on first side faces and second side faces produced by a separation procedure, the first and second side faces forming outer faces of the plastics housing part.

I further yet provide an electronic device including the housing for an electronic device produced by the method of producing a housing for an electronic device including, in a three-dimensional molding process, a housing part assembly consisting of a plurality of contiguous plastics housing parts is produced using a plastics material, and the housing part assembly is split up into a plurality of individual plastics housing parts by a separation procedure, each one of the parts forming at least a part of a housing, wherein the molding process is transfer molding or compression molding, a mold is used for the molding process including mold pins by which first side faces molded on during the molding process are produced on each of the plastics housing parts, the separation procedure results in second side faces being produced on each of the plastics housing parts, and the first and second side faces form outer faces of the plastics housing parts, including a plastics housing part with molded-on first side faces and second side faces produced by a separation procedure, the first and second side faces forming outer faces of the plastics housing part, wherein at least one semiconductor chip is arranged in the plastics housing part.

BRIEF DESCRIPTION OF THE DRAWINGS

FIGS. 2 to 7B are schematic representations of components and method steps of a method of producing a housing for an electronic device according to a further example.

FIGS. 9A to 20 are schematic representations of molds and electronic devices according to further examples.

FIGS. 21A to 22D are schematic representations of shapes of plastics housing parts and mold pins according to further examples.

DETAILED DESCRIPTION

My method of producing a housing for an electronic device may use a three-dimensional molding process. Such a three-dimensional molding process makes it possible to produce a housing part made of a plastics material and forming at least part of the housing with a predefined shape. In particular, in this process it is possible to produce a housing part assembly consisting of a plurality of contiguous plastics housing parts, i.e., a molding formed from a multiplicity of contiguous plastics housing parts. Such a molding may also be designated a "panel." Between the plastics housing parts, regions of the plastics material are present along which singulation to separate the plastics housing parts is performed after the three-dimensional molding process. Singulation may proceed along predetermined dividing lines, preferably by sawing or abrasive cutting. Furthermore, breaking, scoring, punching, laser cutting or a combination of the stated singulation methods may, for example, be performed. The dividing lines may preferably be parallel and orthogonal to one another such that each plastics housing part is detached from the assembly along dividing lines which form right-angled regions.

The three-dimensional molding process may be transfer molding. In this process, the material to be molded in the case of the housing described here a plastics material is inserted into a heatable chamber of a mold. From this, the material to be molded is pressed by the action of heat and/or pressure into a molding chamber constituting a negative mold, formed by hollow spaces, of the housing part assembly.

The three-dimensional molding process may be compression molding. The material to be molded in the case of the housing described here a plastics material is introduced into the molding chamber of a mold constituting a negative mold, formed by hollow spaces, of the housing assembly. Under action of heat and/or pressure, the material to be molded is brought into the desired shape.

Depending on the molding process, the plastics material may, for example, comprise a thermoplastic or a thermoset or consist thereof. For example, the plastics material may comprise siloxanes, epoxides, acrylates, methyl methacrylates, imides, carbonates, olefins, styrenes, urethanes or derivatives thereof in the form of monomers, oligomers or polymers and furthermore also mixtures, copolymers or compounds therewith. For example, the plastics material may include or be an epoxy resin, polymethyl methacrylate (PMMA), polystyrene, polycarbonate, polyacrylate, polyurethane or a silicone resin such as for instance polysiloxane or mixtures thereof.

A mold may be used for the molding process. The mold comprises a molding chamber, which, optionally with elements inserted into the molding chamber to be molded around, constitutes a negative mold of the housing part assembly to be molded. In particular, the mold comprises mold pins in the molding chamber by which first side faces molded on during the molding process are produced on each one of the plastics housing parts. In particular, the mold pins produce the first side faces as outer faces of the subsequently singulated plastics housing parts. In other words, the molding chamber of the mold contains a plurality of mold pins not provided to produce cavities or other hollow spaces within the housing parts but rather produce first side faces forming outer faces. The mold pins are thus located at positions each lying at or between edges and/or corners of the subsequently singulated plastics housing parts and which, in the finished but not yet singulated housing part assembly bring about openings, in particular through-holes, in these regions.

The mold pins may have a cross-sectional area parallel to the main plane of extension of the housing part assembly having a greater extent in the directions perpendicular to the dividing lines along which the housing part assembly is subdivided into individual plastics housing parts than the dividing lines. In other words, the cutouts in the housing part assembly formed by the mold pins are wider than the width of the dividing lines, which may, for example, be sawing or abrasive cutting traces. This results, on splitting up of the housing part panel, in the outer walls of the plastics housing parts formed by the first side faces defined not by the separation procedure but rather by the mold and in particular by the mold pins.

Second side faces likewise forming outer faces of the plastics housing parts may be produced on each of the plastics housing parts by the separation procedure used to split up the housing part assembly into a plurality of individual plastics housing parts. The second side faces are distinguishable from the first side faces due to the different production method since the second side faces may comprise processing traces depending on the separation procedure performed, for example, abrasive cutting or sawing traces detectable at least with microscopic methods. Since the first side faces are produced by the molding process, these do not comprise any traces from such a separation procedure.

Particularly preferably, a method of producing a housing for an electronic device comprises the following features:

in a three-dimensional molding process, a housing part assembly consisting of a plurality of contiguous plastics housing parts is produced using a plastics material;

the molding process is transfer molding or compression molding;

the housing part assembly is split into a plurality of individual plastics housing parts by a separation procedure, each one of these parts forming at least a part of a housing;

a mold is used for the molding process comprising mold pins by which first side faces molded on during the molding process are produced on each of the plastics housing parts;

the separation procedure results in second side faces being produced on each of the plastics housing parts; and the first and second side faces form outer faces of the singulated plastics housing parts.

A housing for an electronic device produced by the method described here may comprise a plastics housing part with molded-on first side faces and second side faces produced by a separation procedure, wherein the first and second side faces form outer faces of the plastics housing part.

An electronic device with a housing may be produced including the method of producing the housing.

An electronic device may comprise a housing produced using the method described here.

The features and examples described above and below apply equally for all methods and objects described here.

The methods and objects described here are based on the following considerations. For mass production of electronic devices with housings, housing parts are manufactured in an assembly of a multiplicity of housing parts from which the individual housing parts for the devices are detached by singulation. Singulation preferably proceeds along parallel and mutually perpendicular sawing lines such that, in the absence of the additional first side faces, produced by the molding process, the singulated housing parts would, due to the second side faces produced by the separation procedure, comprise rectangular base areas conventionally perpendicular to the base area. Such rectangular shapes are in many cases unfavorable, however, for instance if a device is to be arranged in a round cutout, for example, in a corresponding cutout in a lens or if inclined side faces are required.

To achieve outer contours of housings deviating from rectangular shapes, an injection molding method is conventionally used with which the outer contours may be produced as desired. However, electronic devices comprising housings produced in that way often have the dis-advantage that thermal performance is less good than with devices produced by transfer molding or compression molding. Furthermore, housings produced using injection molding methods enable favorable manufacturing costs to be achieved conventionally only for significantly higher numbers of items than in housings produced using transfer or compression molding.

The mold used for the method described here to produce a housing for an electronic device may comprise a lower and an upper mold half which, when joined together, form a hollow space in which the housing part assembly is produced. The lower and upper mold halves may each be of single- or multi-part configuration and form the molding chamber which, optionally with components inserted into the molding chamber and to be molded around, constitutes a negative mold of the housing part assembly subsequently manufactured. The mold pins leading to formation of the first side faces are parts of the lower and/or upper mold halves. In other words, the mold pins take the form of raised portions in the lower and/or upper mold halves. It may here also be that the mold pins are, for example, of two-part configuration and each mold pin comprises a part which is part of the lower mold half, while the other part of each mold pin is part of the upper mold half. In this case, the mold pins are thus formed by the lower and upper mold halves being joined together. Should the housing parts comprise surface patterns such as, for example, raised portions or recesses in their top or bottom, the lower and/or upper mold half comprises further raised portions or recesses as a negative mold of the desired surface patterns of the plastics housing parts. For example, mold elements may be present in the mold, in addition to the mold pins, by which cavities, i.e., recesses or cutouts, are produced in the plastics housing parts of the housing part assembly during the molding process. In particular, the mold elements may be parts of the same mold half as the mold pins and thus project into the molding chamber from the same side as the mold pins.

The plastics housing parts may each comprise a leadframe unit onto which the respective plastics housing part is molded. In particular, such a leadframe unit and a plastics housing part molded thereon may form a "QFN housing" (QFN: "quad flat no leads") or at least a part thereof. To this end, in the molding process the housing part assembly may be molded onto a leadframe assembly consisting of a plurality of contiguous leadframe units. The leadframe assembly is to this end inserted into the mold prior to the molding process. The leadframe assembly is then split up by the separation procedure, together with the housing part assembly.

During the molding process the mold pins may rest on the leadframe assembly. In particular, the mold pins may here form a seal with the leadframe assembly, i.e., rest on the leadframe assembly in a manner creating a seal for the plastics material to produce the housing part assembly. For example, the mold pins may to this end be part of an upper mold half, while the leadframe assembly is inserted into the lower mold half prior to the molding process.

The mold may comprise mold elements, in addition to the mold pins, by which cavities in the plastics housing parts of the housing part assembly are produced during the molding process. In each cavity a part of a leadframe unit may preferably be free of plastics material. Thus, with the assistance of the mold elements, recesses may be produced in the form of cavities in the plastics housing parts, the base of which is formed by parts of the respective leadframe unit. If, as previously described, the mold pins rest on the leadframe assembly during the molding process, the mold pins and mold elements preferably have the same height.

As a result of an appropriate geometry of the leadframe assembly, it is thereby possible, for example, to place the upper mold half solely on the leadframe assembly such that, during the molding process, the sealing surfaces all lie on a plane formed by the surface of the leadframe assembly remote from the lower mold half. This makes it possible for the same tolerances to apply to the mold pins as to the molding elements such that no splinters or the like arise during the separation procedure, for example, sawing. Because the mold pins rest on the leadframe assembly and form a seal therewith, in the subsequently singulated leadframe units with the molded-on plastics housing parts regions of the leadframe are visible at the first side faces. It may be particularly advantageous for the regions of the leadframe assembly along the dividing lines for singulation at least in part to have a full material thickness, i.e., a maximum thickness of the leadframe. Furthermore, it may be advantageous for singulation of the leadframe assembly with the molded-on housing part assembly to proceed from the back, i.e., from the leadframe side. This makes it possible to prevent burrs from arising on the back if sawing is used as the singulation method. Such singulation is in particular also advantageous when the finished housing has solder control patterns.

The leadframe assembly may comprise openings through which the mold pins project during the molding process. In other words, a leadframe assembly comprising openings in the regions in which mold pins are present when the mold is closed is inserted into the mold, for example, into the lower mold half. The mold pins may, for example, be arranged on the upper mold half and project into the openings in the leadframe assembly as a result of the mold halves being joined together. It is in particular advantageous for the mold pins to rest on the opposing mold half, i.e., in the described case on the lower mold half, and to form a seal therewith. Alternatively, it is also possible for the mold pins to be part of the lower mold half into which the leadframe assembly is inserted prior to the molding process such that the mold pins project through the openings in the leadframe assembly as early as after arrangement of the leadframe assembly in the lower mold half. It is particularly advantageous if the mold pins rest on the opposing, i.e., in this case the upper, mold half and form a seal therewith. If, in addition to the mold pins, the mold comprises mold elements by which, during the molding process, cavities in the form of recesses in the plastics housing parts of the housing part assembly are produced in which, for example, part of a respective leadframe unit is free of plastics material, the mold elements have a smaller height than the mold pins since the mold pins project through the leadframe assembly while the mold elements rest on the leadframe assembly. In this case, the mold pins thus preferably have a height greater by the leadframe thickness than the mold elements.

The leadframe preferably does not have to be configured such that the mold pins may be placed on a solid material, i.e., a leadframe region with full material thickness. Furthermore, it is advantageously possible to ensure that in the region of the first side faces the leadframe material is encapsulated at least in part by plastics material such that the leadframe units are covered in the region of the first side faces by the plastics material.

To produce an electronic device an electronic semiconductor chip may be arranged in a housing produced using the described method. If the housing comprises a plastics housing part molded onto a leadframe unit, the semiconductor chip may be arranged in the housing in particular after the molding process and prior to singulation of the panel or indeed after the singulation process. The electronic semiconductor chips may, for example, be optoelectronic semiconductor chips such as for instance light-emitting diode chips or photodiode chips. Furthermore, the electronic semiconductor chips may also be other non-optoelectronically active semiconductor chips such as for instance transistors or integrated circuits. The semiconductor chips may comprise additional layers, for example, in light-emitting semiconductor chips, wavelength conversion layers.

The semiconductor chip may be encapsulated by the plastics housing part using the molding process. To this end, it is advantageously possible, in the method of producing the housing, to provide a plurality of semiconductor chips on a foil or a leadframe assembly. The foil or the leadframe assembly with the plurality of semiconductor chips is inserted into the mold. In a foil, during the molding process, the mold pins rest on the foil and preferably form a seal therewith. In such a "foil-assisted molding" method, a plurality of semiconductor chips may thus simultaneously be encapsulated with the plastics material to form the housing part assembly. Furthermore, it is also possible to use a foil-assisted method in conjunction with a leadframe assembly or already singulated leadframe units. In this case too, it is advantageously possible to ensure that no metal of the leadframe is visible in the region of the first side faces of the finished device. It may be advantageous to ensure, in a foil-assisted molding method, that as far as possible no splinters arise during subsequent singulation, even if there are fluctuations in the heights of the individual components placed onto the foil, for example, semiconductor chips, adhesive layers and/or further layers such as for instance wavelength conversion layers on the semiconductor chips.

My electronic device may comprise a housing produced using the method described here and in which at least one semiconductor chip is arranged in the plastics housing part.

In the plastics housing part described here, at least one first side face may adjoin a second side face. For example, a second side face may also each adjoin a first side face on two sides. Furthermore, a first side face may also each adjoin a second side face on two sides. Furthermore, it is also possible for two first side faces to adjoin one another, these in turn each adjoining second side faces. Mutually adjacent side faces form outside edges of the plastics housing part. In particular, an outside edge formed by a first and a second side face adjacent thereto may be a non-right-angled outside edge. In other words, the plastics housing part preferably comprises at least one first side face and one second side face adjacent thereto, these not adjoining one another at a right angle and thus forming a non-right-angled outside edge. The angle at which the side faces adjoin one another may, for example, be a 135° angle or a 120° angle. Furthermore, other angles between first and second side faces are also possible.

The plastics housing part may have a basic shape different from a rectangular basic shape. The basic shape of the plastics housing part may in particular be the cross-sectional area of the plastics housing part along the main plane of extension of the plastics housing part which corresponds to the main plane of extension of the housing part assembly. In particular, the basic shape may, for example, be defined by a base area of the plastics housing part, thus for instance by a bottom. The plastics housing part may here comprise second side faces each arranged at right angles or parallel to one another in pairs. For instance, in addition to the first side faces the plastics housing part may in particular comprise second side faces arranged solely parallel or at right angles to one another in pairs such that in the absence of the first side faces the plastics housing part would have a rectangular basic shape due to the second side faces. The first side faces, on the other hand, are arranged not at right angles and not parallel to the second side faces, with the possible result of a basic shape deviating from a rectangular basic shape. The second side faces may in particular be straight faces, while the first side faces may be straight, angled or also curved side faces. The plastics housing part may, for example, have a polygonal shape, for instance a pent-, hex-, hept- or octagonal shape or a shape with even more corners, the corners here being formed by the outside edges of in each case two mutually adjacent side faces. Furthermore, the plastics housing part may also have curved side faces displaying curvature along a segment of a circle, an ellipse or any desired polygonal curve in a section plane parallel to the main plane of extension of the plastics housing part. In other words, the first side faces may form beveled and/or rounded portions of the plastics housing part, which can only be produced with difficulty or not at all by separation procedures.

At least one first side face may comprise an inclination deviating from an inclination of a second side face and is different therefrom. Inclination is used to mean tilting of a side face about a tilt axis lying in the main plane of extension of the plastics housing part or parallel thereto. Due to one or more tilted first side faces, the cross-section of the plastics housing part may vary in different section planes parallel to the main plane of extension of the plastics housing part and, for example, become wider or narrower in an upwards direction. To produce first side faces with a different inclination from the second side faces, mold pins may be used having a conical shape and thus, for example, have a cross-section becoming smaller as the distance increases from the mold half to which the mold pins belong. The mold pins may here, for example, take the form of cylinders or truncated cones or truncated pyramids.

At least one first side face may comprise a recess or protrusion. The recess or protrusion may in particular be a surface pattern that cannot be produced or can be produced only with difficulty by a separation procedure. For example, a recess or protrusion may take the form of an adjustment aid, for example, for a further element to be arranged on the device such as, for instance, an optical element or an engaging element that fastens a further element to the device.

With the methods and objects described here, it is advantageously possible to produce non-rectangular housings and thus non-rectangular devices using a transfer molding method or a compression molding method. The housing and devices may be shaped largely freely such that outer faces, in particular first outer faces, may serve as alignment or fastening faces for further elements such as, for example, optical components. For example, first side faces forming beveled or rounded portions, may serve, in a round cutout under a lens, as alignment or fastening faces. Furthermore, surface patterns are possible to fasten the housing or the device itself or further elements. It is, for example, also possible by engaging elements in the first side faces to clip the housing or electronic device to an electrical contact with spring-loaded contact pins ("pogo pins"). The first side faces, which are outer faces not produced by a separation procedure but rather defined by the mold and optionally the leadframe used, may have very tight tolerances. It may thus be possible to circumvent usual tolerances associated with separation procedures such as, for example, sawing or abrasive cutting procedures in particular if components have to be aligned with one another or with other components. Since the first side faces are already defined by the molding process and no longer destroyed in the subsequent process such as, for example, a separation procedure, they may, for example, also be available for markings such as for instance a laser code for registration and traceability of a device.

Further advantages and further developments are revealed by the examples described below in association with the figures.

In the examples and figures, identical, similar or identically acting elements are provided with the same reference numerals. The elements illustrated and their size ratios to one another should not be regarded as being to scale, but rather individual elements such as, for example, layers, components, devices and regions may have been made exaggeratedly large to illustrate them better and/or to aid comprehension. Where a multiplicity of similar elements or components are shown in a figure, for clarity's sake just some of these similar elements or components may be provided with reference signs.

Figure 1:
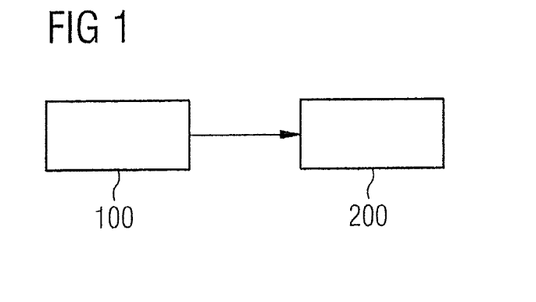
FIG. 1 is a schematic representation of a method of producing a housing for an electronic device according to one example.

FIG. 1 shows an example of a method of producing a housing for an electronic device. In a first method step 100, a housing part assembly consisting of a plurality of contiguous plastics housing parts is produced from a plastics material using a three-dimensional molding process. In a further method step 200, the housing part assembly is split up in a separation procedure into a plurality of individual plastics housing parts, each of which forms at least a part of a housing. Further features of the method are described in conjunction with the following figures.

In particular, in conjunction with FIGS. 2 to 7B a method is described, purely by way of example, of producing a housing for an electronic device taking the form of a "QFN housing." To produce a housing for such a device, a molding process selected from transfer molding or compression molding is used, in which a leadframe is encapsulated with plastics material. This results in a "panel," optionally singulated after further mounting and processing steps. Individual production steps to produce the housing are explained more precisely below, wherein, in addition to the described method steps, further method steps, for example, to mount further components or for more extensive processing are possible therebetween, therebefore or thereafter these.

Figure 2:
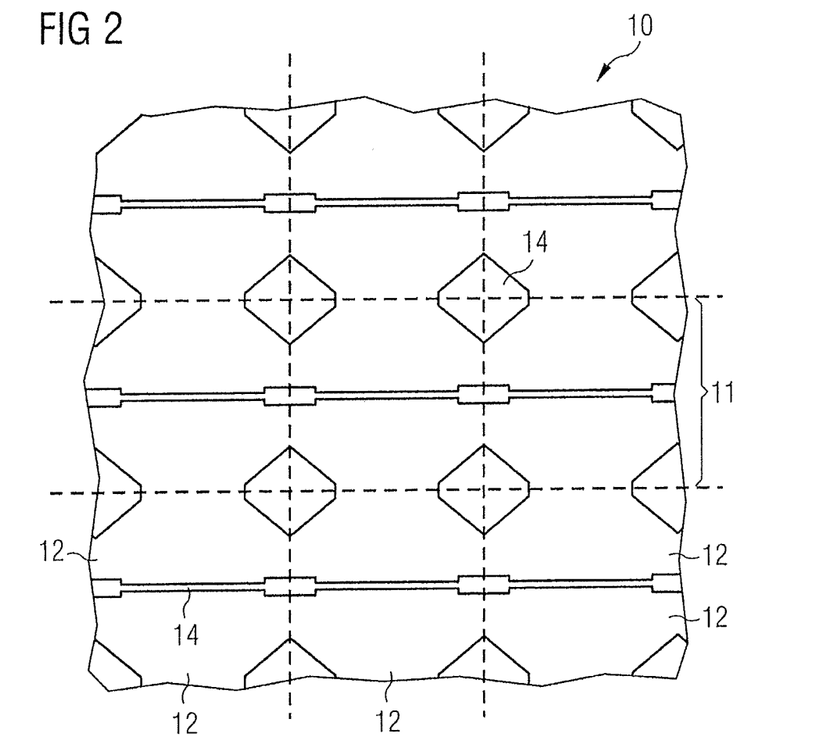

FIG. 2 shows a method step in which a leadframe assembly 10 is provided. The leadframe assembly 10 comprises a plurality of leadframe units 11 indicated by the dashed lines. The leadframe units 11 connect to one another in the leadframe assembly 10 and accordingly form a matrix of leadframe units 11. In the example shown, each of the leadframe units 11 comprises two leadframe parts 12 separated from one another by a gap 14' such that subsequent electrical contacting of an electronic component such as for instance a semiconductor chip is possible.

In regions between the leadframe units 11, the leadframe assembly 10 comprises widened portions of the gap 14'. Together with recesses in the back of the leadframe visible, for example, in FIG. 5b, such widened portions form leadframe regions of reduced material thickness that make it easier to separate the leadframe assembly 10 into singulated leadframe units 11 using a separation procedure.

Furthermore, the leadframe assembly comprises openings 14 surrounded by four leadframe units 11 or leadframe parts 12. The openings 14 are virtually rhomboid such that the leadframe units 11 have a substantially octagonal basic shape. Slight deviations from this basic shape result, for example, from regions between the leadframe units 11 provided for subsequent singulation.

Figure 3:
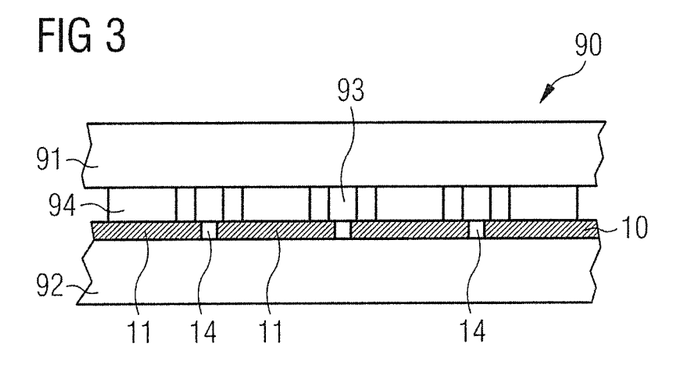
Figure 4:
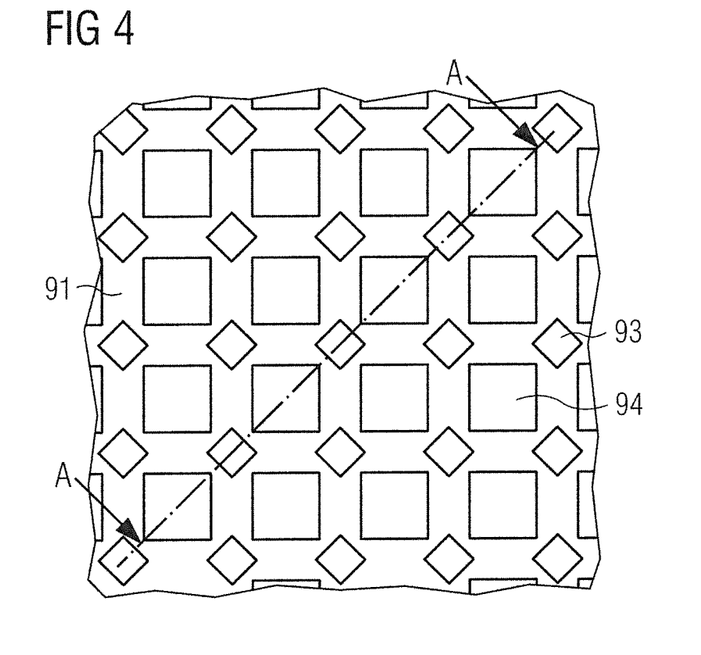

In a further method step shown in conjunction with FIGS. 3 and 4, a mold 90 is provided into which the leadframe assembly 10 is inserted. The gaps 14' shown in FIG. 2 between the individual leadframe parts 12 are not shown in FIG. 3 for clarity's sake.

The mold 90 comprises an upper mold half 91 and a lower mold half 92, which may be of single- or multi-part construction and which, when joined together, form a mold chamber formed by a hollow space, in which chamber the leadframe assembly 10 is arranged.

The representation in FIG. 4 corresponds to a plan view onto the bottom, forming part of the mold chamber, of the upper mold half 91 from the perspective of the lower mold half 92 or from the perspective of the leadframe 10. The section plane labeled AA indicates the section plane shown in FIG. 3. The mold 90 may comprise further parts to carry out the known molding process depending on the molding process used and therefore are not shown here for clarity's sake.

In the example shown, the upper mold half 91 comprises mold pins 93. The mold pins 93 are configured such that they have a rhomboid cross-sectional area, as is visible in FIG. 4. In particular, the position of the mold pins 93 corresponds to the openings 14 in the leadframe assembly 10, wherein the mold pins 93 have a larger cross-sectional area than the openings 14. As is visible in FIG. 3, the mold pins 93 thereby rest in the region of the openings 14 on the leadframe assembly 10 and form a seal therewith.

In addition to the mold pins 93, the mold 90 comprises as part of the upper mold half 91 mold elements 94 likewise resting on the leadframe 10 and by which cavities are defined during the molding process in each of which a part of a leadframe unit 11 is free of plastics material. Since the upper mold half 91 rests with the mold pins 93 and the mold elements 94 exclusively on the leadframe assembly 10, all the sealing surfaces for the molding process lie in one plane formed by the top of the leadframe assembly 10 such that the same tolerances apply for the mold pins 93 as for the mold elements 94.

Figure 5A:
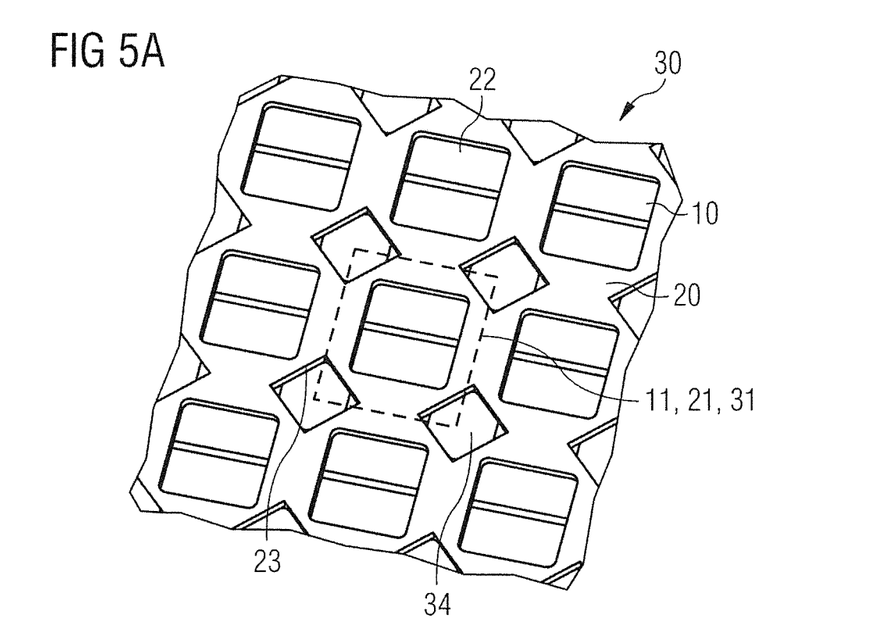
Figure 5B:
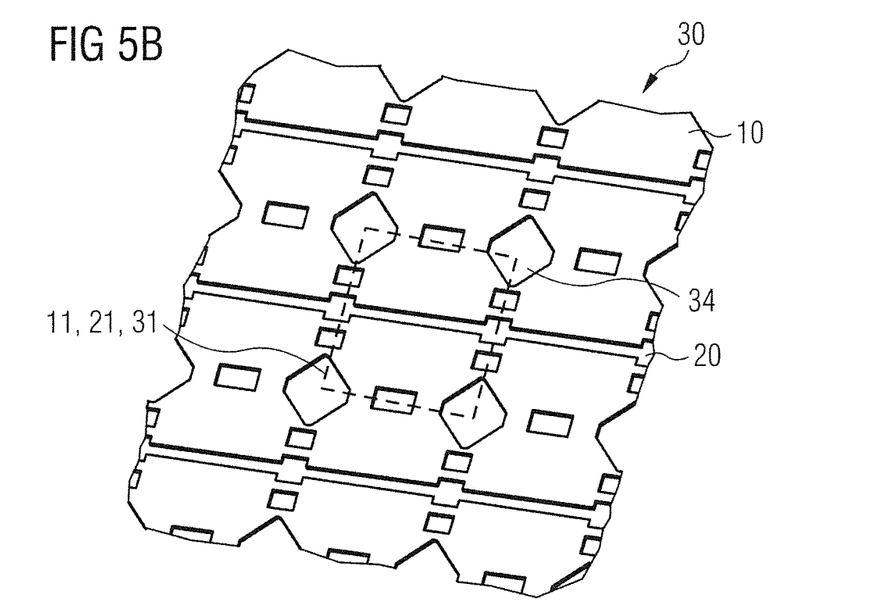

In a three-dimensional molding process, i.e., transfer molding or compression molding, a plastics material is introduced into the mold chambers formed by the mold halves 91, 92, which plastics material fills the hollow spaces in the mold chamber and so forms a housing part assembly 20 consisting of a plurality of plastics housing parts 21 as shown in FIGS. 5A and 5B. In particular, the leadframe assembly 10 and the housing part assembly 20 molded thereon form a housing assembly 30. FIG. 5A shows a plan view onto the top of the housing assembly 30, while FIG. 5b shows a plan view onto the bottom of the housing assembly 30 formed in part by the leadframe assembly 10. Accordingly, the leadframe units 11 and the molded-on plastics housing parts 21 form contiguous housings 31 forming the housing assembly 30. By the dashed lines, an individual leadframe unit 11, an individual plastics housing part 21 and an individual housing 31 are indicated in FIGS. 5A and 5B.

As is visible in FIG. 5A, the housing assembly 30 comprises openings 34 produced by the molding process and in particular by the mold pins 93. The openings 34 are surrounded by side faces 23, which result, due to the production process, in molded-on first side faces 23 of the subsequently singulated housing 31. Furthermore, the housing assembly comprises one cavity 22 for each housing 31, these being produced in the molding process by the mold elements 94 and having partially exposed within them the respective leadframe unit 11, which is therefore accessible for mounting and contacting an electronic device such as for instance an electronic semiconductor chip.

Figure 6:
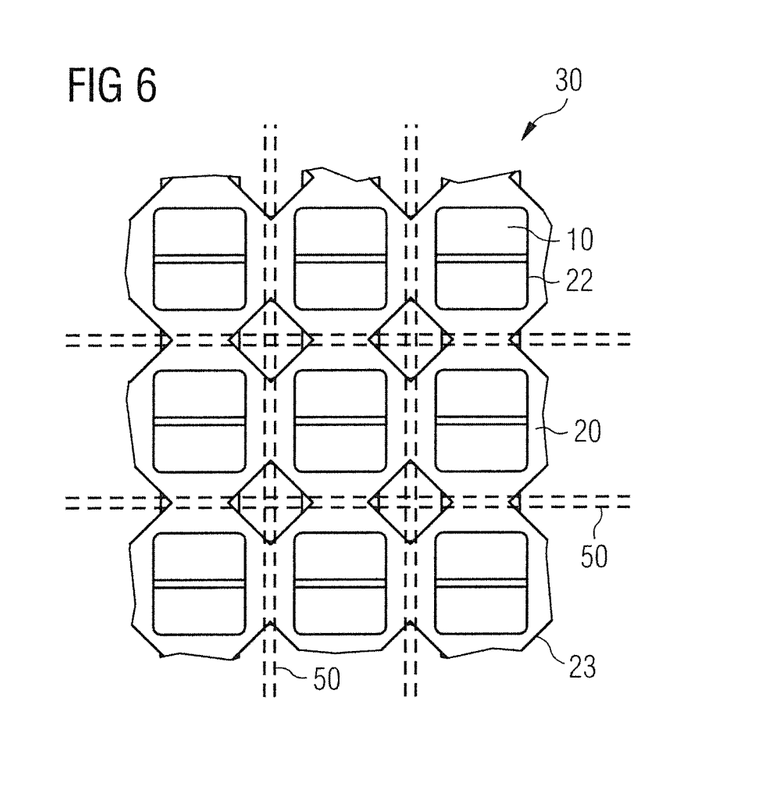

FIG. 6 shows the housing assembly 30 in plan view, wherein the dashed lines indicate dividing lines 50 along which singulation of the housing assembly 30 and thus also joint singulation of the leadframe assembly 10 and of the housing part assembly 20 takes place. Singulation may proceed by a suitable separation procedure such as, for example, sawing or abrasive wheel cutting or another procedure mentioned above in the introductory part. The dividing lines 50 are orthogonal and parallel to one another.

Figure 7A:
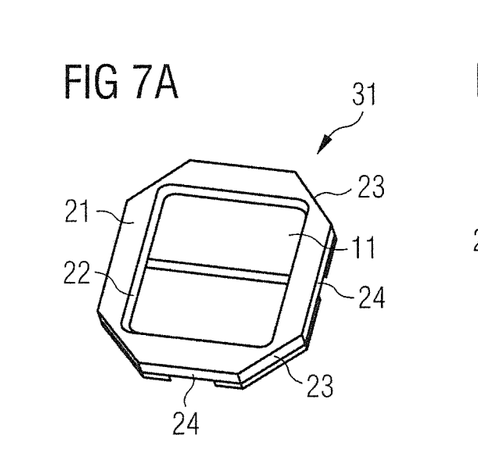
Figure 7B:
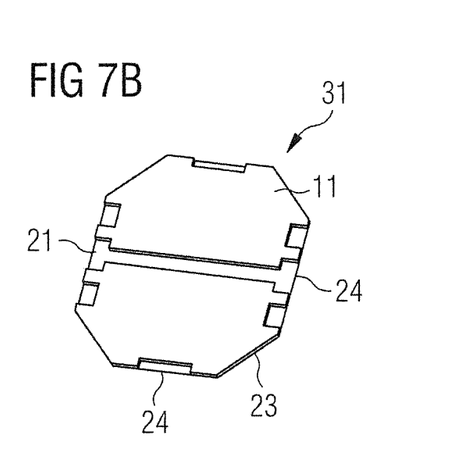

FIGS. 7A and 7B show a corresponding singulated housing 91 in plan view onto a top according to FIG. 7A and in plan view onto a bottom formed substantially by the leadframe unit 11 according to FIG. 7B. In addition to the first side faces 23, which were already visible in the housing assembly 30, the housing 31 comprises second side faces 24 produced by the separation procedure and which, unlike the first side faces 23, may display traces of the separation procedure. Due to the fact that the mold pins 93 rest on and form a seal with the leadframe assembly 10, as described above in conjunction with FIG. 3, the leadframe is visible in the region of the first side faces 23 and projects below the plastics housing part 21.

The first side faces 23 adjoin second side faces 24 and form non-right-angled outside edges therewith such that the plastics housing part 21 and thus the housing 31 has a basic shape deviating from a rectangular basic shape. In the example shown, the plastics housing part 21 and thus the housing 31 have an octagonal basic shape. Further basic shapes for the plastics housing part 21 are described further below, in conjunction with FIGS. 19A to 19E.

Figure 8A:
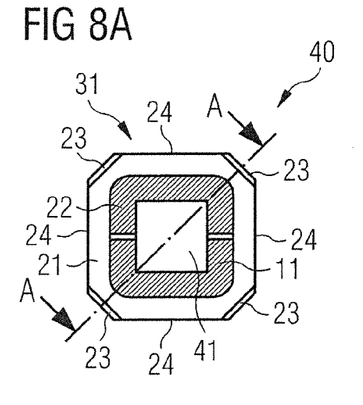
FIGS. 8A and 8B are schematic representations of an electronic device according to a further example.
Figure 8B:
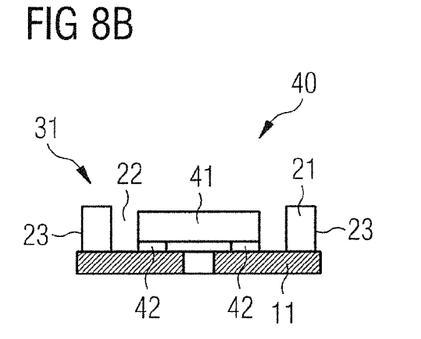

FIGS. 8A and 8B are schematic representations of an example of an electronic device 40 comprising a housing 31 produced according to the above description. The representation of FIG. 8B corresponds to a section along section plane AA through the electronic device 40 shown in FIG. 8A in plan view from the top.

The electronic device 40 has an electronic semiconductor chip 41 in the housing 31 mounted on the leadframe unit 11 and electrically contacted by contacts 42 such as, for example, solder contacts. The electronic semiconductor chip 41 may, for example, be an optoelectronic semiconductor chip such as for instance a light-emitting diode chip or a photodiode chip. Furthermore, the electronic semiconductor chip may also be another, non-optoelectronically active semiconductor chip such as for instance a transistor or an integrated circuit. The electronic semiconductor chip 41 and accordingly also the configuration of the leadframe 11 are shown purely by way of example and may deviate from the representation shown, depending on the construction of the semiconductor chip 41. It is moreover also possible for further elements such as for instance further electronic components to be arranged in the housing 31. Furthermore, it is also possible for other, non-electronic components to be arranged in or on the housing 31. In a light-emitting semiconductor chip 41 it is, for example, possible to arrange thereover a wavelength conversion material in the form of a conversion plate or a potting compound in the cavity 22 or on the semiconductor chip 41. In non-optoelectronically active semiconductor chips 41, it is, for example, also possible to arrange an opaque cover on the housing 31. Mounting of the semiconductor chip 41 may proceed either prior to the separation step of singulating the housing 31 explained in conjunction with the preceding figures or indeed thereafter.

Because the electronic device 40, i.e., in particular the housing 31, has a non-rectangular basic shape in which the first side faces 23 are configured as beveled portions in addition to the second side faces 24, it is more readily possible, for example, in a light-emitting device 40, to mount the latter under a lens with a round cutout than a corresponding device with a rectangular basic shape.

Figure 9A:
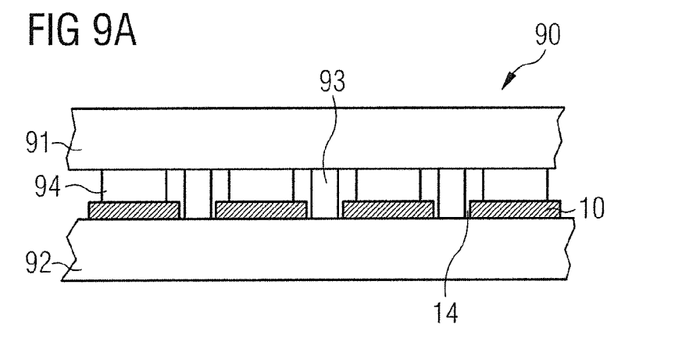
Figure 9B:
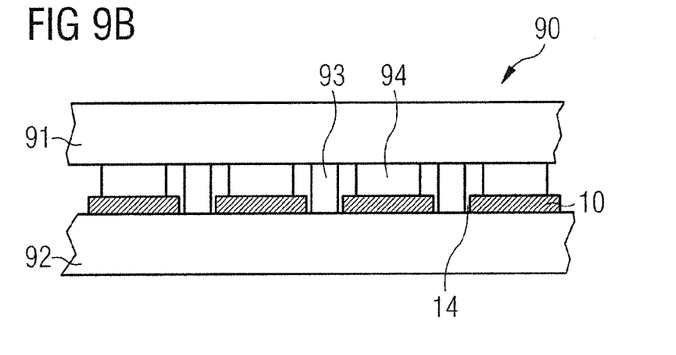
Figure 10:
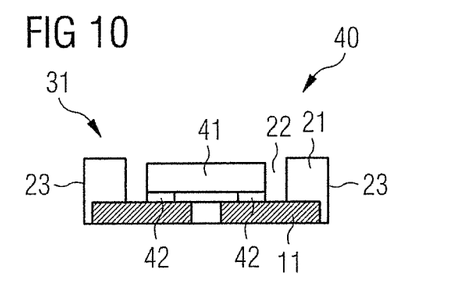

FIGS. 9A and 9B show further examples of molds 90 by which a housing 31 and accordingly an electronic device 40 may be produced as shown in FIG. 10.

In contrast to the mold of FIG. 3, the mold in FIG. 9A comprises mold pins 93 projecting through the openings 14 in the leadframe assembly 10. To this end, the mold pins 93 have a smaller cross-section than the openings 14 in the leadframe assembly 10. In particular, the mold pins 93 preferably rest on the lower mold half 92 and form a seal therewith. In this way, the leadframe assembly 10 does not have to be configured such that the mold pins 93 can be placed thereon so that preferably no solid material is necessary in the region of the mold pins 93. To achieve the best possible seal between the mold elements 94 and mold pins 93 and the leadframe assembly 10 or the lower mold half 92, the mold pins 93 preferably have a length which corresponds to the sum of the height of the mold elements 94 and the thickness of the leadframe assembly 10.

FIG. 9B shows a further example of a mold 90 in which, as an alternative to the example of FIG. 9A, the mold pins 93 are part of the lower mold half 92 and accordingly rest on the upper mold half and form a seal therewith.

By the molds 90 of FIGS. 9A and 9B, it is possible to produce a housing 31 which, as shown in FIG. 10, in the region of the first side faces 23 encapsulates the leadframe unit 11 such that the leadframe is not exposed in the region of the first side faces 23 in contrast to the example of FIGS. 8A and 8B.

Figure 11:
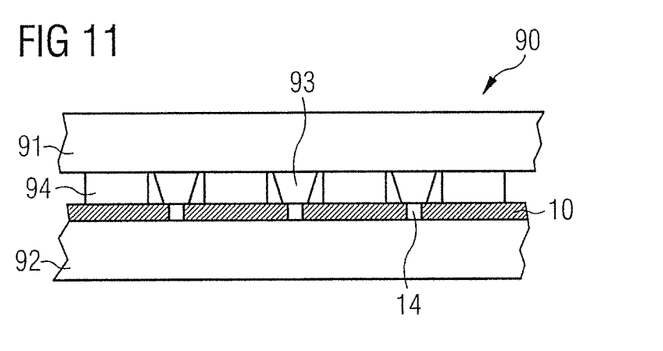
Figure 12:
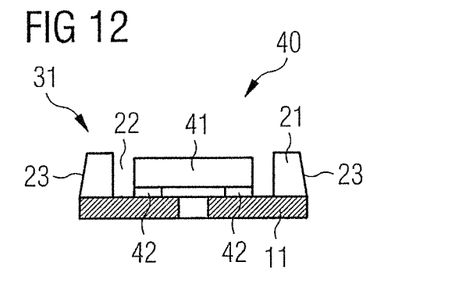

FIG. 11 shows a further example of a mold 90 which, in contrast to the mold 90 of FIG. 3, comprises not cylindrical but rather conically tapering mold pins 93 and with which a housing 31 for an electronic device 40 may be produced as shown in FIG. 12. It is in particular possible, as shown in FIG. 12, to produce first side faces 23 displaying an inclination different from the inclination of the second side faces 24 which, due to the separation procedure, are conventionally perpendicular to the base area. The electronic device 40 or the housing 31 of the example of FIG. 12 thus represents a modification of the electronic device 40 or of the housing 31 of the example of FIGS. 8A and 8B.

Figure 13:
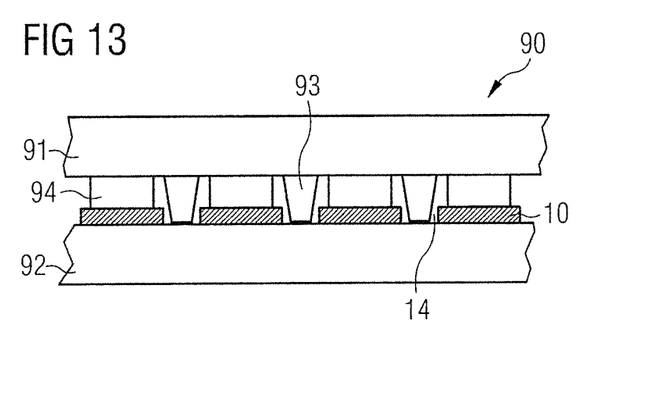
Figure 14:
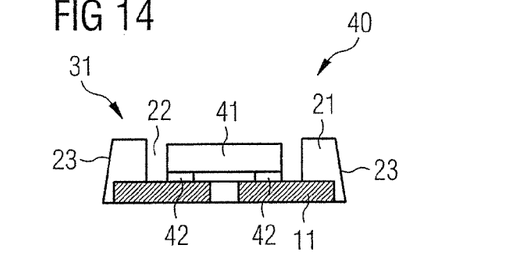

FIG. 13 shows a further example of a mold 90 representing a modification of the mold 90 shown in FIG. 9A and in which, as with the mold 90 of FIG. 11, the mold pins 93 have a cross-sectional area tapering away from the first mold half 91. As shown in FIG. 14, it is thereby possible to produce an electronic device 40 with a housing 31 which, as in the example shown in FIG. 10, encapsulates the leadframe unit 11 in the region of the first side faces 23, wherein, due to the conical shape of the mold pins 93, the side faces 23 display an inclination other than the inclination of the second side faces.

Figure 15:
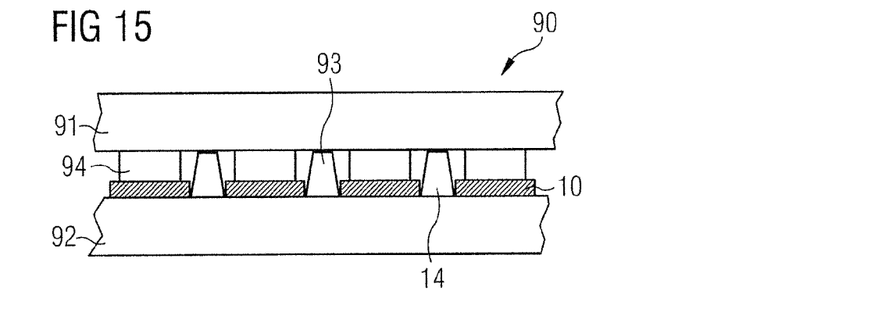
Figure 16:
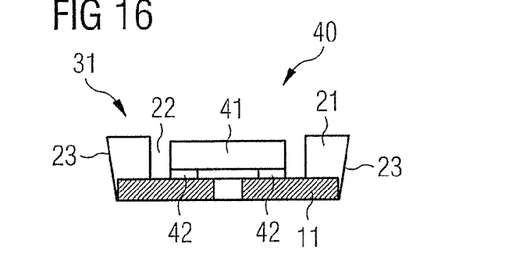

FIG. 15 shows a further example of a mold 90 representing a modification of the mold 90 shown in FIG. 9B, in which the mold pins 93 are part of the lower mold half 92. As in the previous two examples of FIGS. 11 and 13, the mold pins 93 are conical in shape such that, as shown in FIG. 16, a housing 31 for an electronic device 40 may be produced having inclined side faces 23. As a result of the arrangement of the mold pins 93 as part of the lower mold half 92, according to the example of FIG. 16 the side faces 23 display the opposite inclination to the examples of FIGS. 12 and 14.

Figure 17:
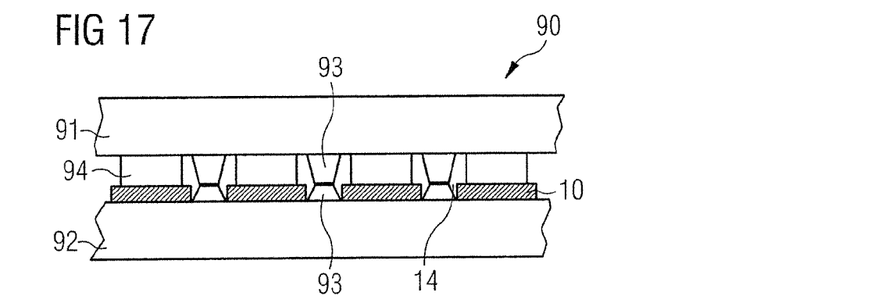
Figure 18:
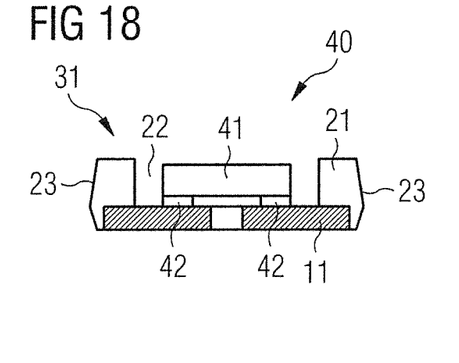

FIG. 17 shows a further example of a mold 90 which, in contrast to the previous molds, comprises mold pins 93 as part of the lower mold half 92 and further mold pins 93 as part of the upper mold half 91. The mold pins 93 of the two mold halves 91, 92 rest on one another in the closed mold 90 and form a seal with one another such that when the mold halves 91, 92 are joined together the final mold pins are formed. Purely by way of example, the mold pins 93 each have a conical shape such that, as shown in FIG. 16, a housing 31 for an electronic device 40 may be produced having angled side faces 23 with differently inclined sub-faces.

Figure 19:
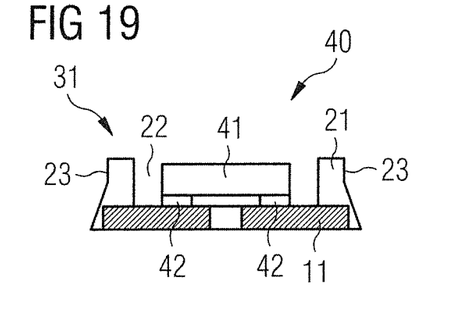
Figure 20:
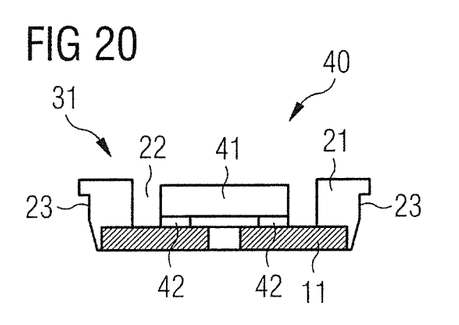

By modifying the shape of the mold pins 93, it is also possible to produce first side faces 23 having differently inclined sub-regions to provide functionalities as shown purely by way of example in FIGS. 19 and 20. In these examples, the first side faces 23 comprise recesses or protrusions which may, for example, take the form of adjustment aids or engaging elements by which additional components such as, for example, optical components may be arranged and/or mounted. Furthermore, it is also possible to engage the electronic device 40 in a holder by engaging elements and, for example, to contact it electrically with spring-loaded pins.

FIGS. 21A to 21E show plan views of plastics housing parts 21 according to further examples having different basic shapes. FIGS. 22A to 22D show corresponding cross-sectional shapes of the mold pins 93 to produce the first side faces 23 thereof.

Figure 21A:
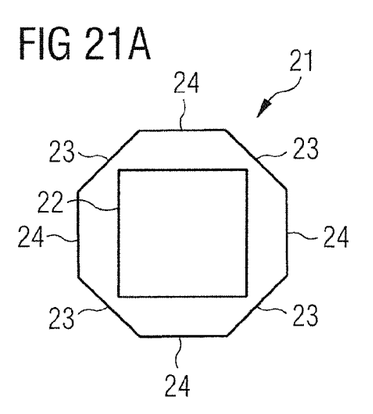

The basic shape shown in FIG. 21A here corresponds to the basic shape shown in conjunction with the previous examples. The first side faces 23 may be produced by mold pins 93 with the cross-sectional shape shown in FIG. 22A as also explained further above in conjunction with the method of FIGS. 2A to 7B.

Figure 21B:
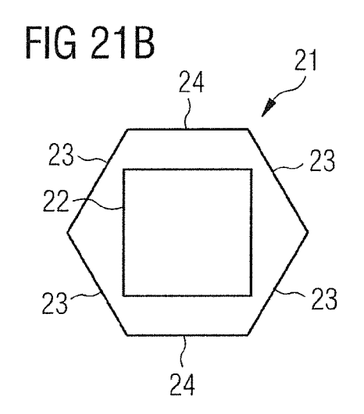
Figure 22A:
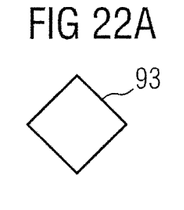
Figure 22B:
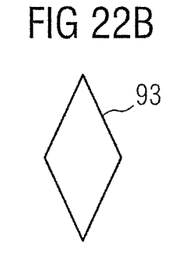

FIG. 21B shows a further example in which the plastics housing part 21 has a hexagonal shape in which two first side faces 23 adjoin one another and form a common outside edge. FIG. 22B shows the corresponding cross-sectional shape of suitable mold pins 93 which, unlike in the example of FIG. 22A, has a rhomboid shape. The hexagonal basic shape shown in FIG. 21B may be advantageous, for example, if a multiplicity of electronic devices 40 with such a basic shape are to be arranged in a hexagonal matrix. In this way, for example, electronic devices comprising light-emitting semiconductor chips may be arranged as a polychrome matrix, for example, as an RGB matrix.

Figure 21C:
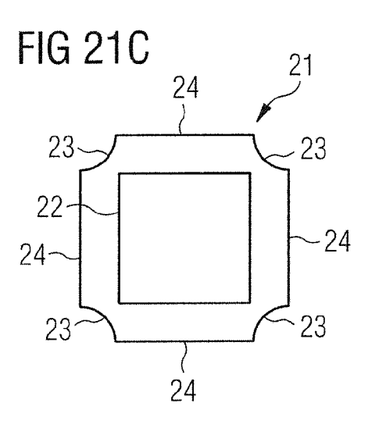
Figure 22C:
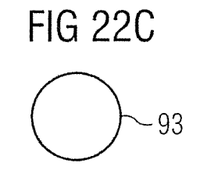

FIG. 21C shows an example in which, in the plan view shown, the first side faces 23 are curved in the form of a segment of a circle. FIG. 22C shows the corresponding cross-sectional shape for mold pins 93 suitable therefor.

Figure 21D:
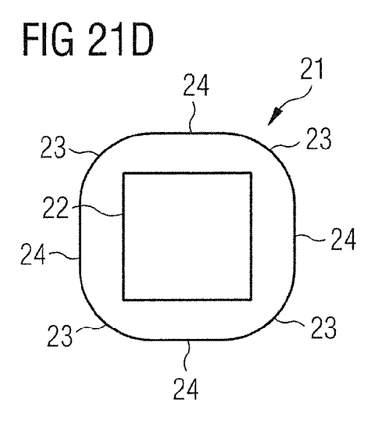
Figure 21E:
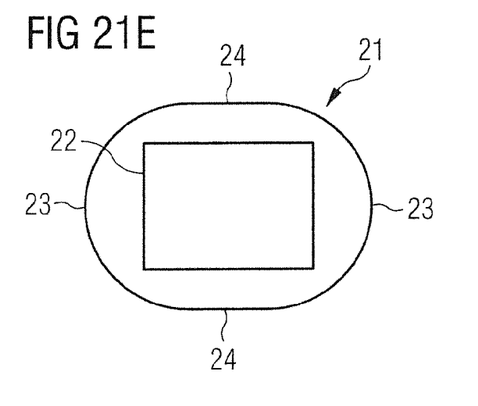
Figure 22D:
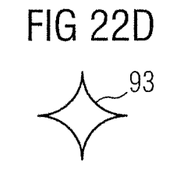

FIGS. 21D and 21E show examples of plastics housing parts 21 in which the first side faces 23 have an outwardly curved rounded portion which may, for example, be advantageous in an arrangement of an electronic device under a round optical element such as for instance a lens. FIG. 22D shows the cross-sectional area for correspondingly embodied mold pins 93.

Figure 23:
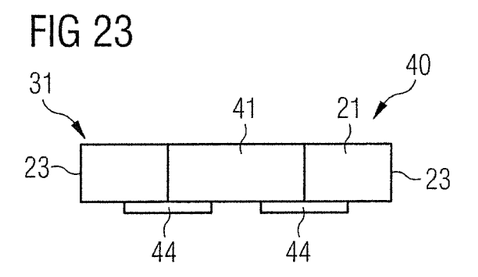
FIGS. 23 and 24 are schematic representations of an electronic device and a mold according to further examples.

FIG. 23 shows an example of an electronic device 40 comprising a housing 31 with a plastics housing part 21 molded directly onto a semiconductor chip 41. By subsequently applied contact elements 44, the semiconductor chip 41 may be electrically mounted and contacted. The housing 31 of the electronic device 40 according to the example in FIG. 23 may have the different geometric configurations of the plastics housing part 21 described in conjunction with the preceding examples, for instance inclined first side faces 23 and/or first side faces with recesses or protrusions and/or first side faces 23 which form beveled or rounded portions.

Figure 24:
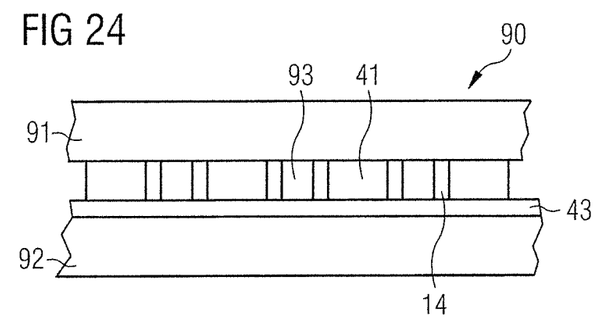

FIG. 24 shows an example of a mold 90 suitable to produce the housing part 21 shown in FIG. 23. The upper mold half 91 only comprises the mold pins 93. A foil with semiconductor chips 41 arranged thereon is inserted into the lower mold half 92, wherein, once the mold halves 91 and 92 have been joined together, the mold pins 93 terminate at the foil 43 and form a seal therewith. By the above-described method, the semiconductor chips 41 may thus be encapsulated with a plastics housing part assembly configured as desired, which may then be split up into individual electronic devices 40 with correspondingly configured housings 31 and plastics housing parts 21.

The semiconductor chips 41 on the foil 43 may, for example, also comprise additional elements for instance wavelength conversion layers in light-emitting diode chips. These, together with the semiconductor chips 41, are encapsulated with the plastics material.

Such a foil-assisted molding method may also be used in conjunction with the previously described examples.

The examples and features shown in the figures may, according to further examples, also be combined together even if such combinations have not been explicitly mentioned or described. Moreover, the examples described in the figures may have additional or alternative features according to the introductory part of the description.

The description made with reference to examples does not restrict this disclosure to these examples. Rather, the disclosure encompasses any novel feature and any combination of features including in particular any combination of features in the appended claims, even if the feature or combination is not itself explicitly indicated in the claims or examples.

This application claims priority of DE 10 2014 103 942.4, the subject matter of which is hereby incorporated by reference.

The invention claimed is:

1. A method of producing a housing for an electronic device comprising:
   in a three-dimensional molding process, a housing part assembly consisting of a plurality of contiguous plastics housing parts is produced using a plastics material; and
   the housing part assembly is split up into a plurality of individual plastics housing parts by a separation procedure, each one of the parts forming at least a part of a housing,
   wherein the molding process is transfer molding or compression molding,
   a mold is used for the molding process comprising a multiplicity of columnar-shaped mold pins by which first side faces molded on during the molding process are produced on each of the plastics housing parts,
   the separation procedure results in second side faces being produced on each of the plastics housing parts, and
   the first and second side faces form outer faces of the plastics housing parts.

2. The method according to claim 1, wherein, after the housing part assembly has been split up, the second side faces display traces of the separation procedure.

3. The method according to claim 1, wherein the mold comprises a lower mold half and an upper mold half which, when joined together, form a hollow space in which the housing part assembly is produced, and the mold pins are parts of the lower and/or upper mold half.

4. The method according to claim 1, wherein, in the molding process, the housing part assembly is molded onto a leadframe assembly consisting of a plurality of contiguous leadframe units and the leadframe assembly together with the housing part assembly is split up by the separation procedure.

5. The method according to claim 4, wherein the leadframe assembly is inserted into the mold and the mold pins rest on the leadframe assembly during the molding process.

6. The method according to claim 4, wherein the leadframe assembly is inserted into the mold and comprises openings through which the mold pins project during the molding process.

7. The method according to claim 4, wherein, in addition to the mold pins, the mold comprises mold elements by which cavities are produced in the plastics housing parts of the housing part assembly during the molding process, in each of which cavities a part of a leadframe unit is free of plastics material.

8. The method according to claim 1, in which a plurality of semiconductor chips are inserted into the mold on a foil and during the molding process the mold pins rest on the foil.

9. The method according to claim 1, wherein at least one first side face comprises a recess or protrusion in the form of an adjustment aid or an engaging element.

10. The method according to claim 1, wherein the mold pins have a columnar-conical shape such that the first side faces are produced with a different inclination from the second side faces.

11. A method of producing an electronic device in which an electronic semiconductor chip is arranged in a housing produced using the method according to claim 1.

12. The method according to claim 11, wherein, after the molding process, the semiconductor chip is arranged in the housing.

13. The method according to claim 11, wherein the semiconductor chip is encapsulated by the plastics housing part using the molding process.

14. A housing for an electronic device produced by the method according to claim 1, comprising a plastics housing part with molded-on first side faces and second side faces produced by a separation procedure, the first and second side faces forming outer faces of the plastics housing part.

15. The housing according to claim 14, wherein, in the plastics housing part, at least one first side face adjoins a second side face and forms a non-right-angled outside edge therewith.

16. The housing according to claim 14, wherein the plastics housing part has a basic shape deviating from a rectangular basic shape.

17. An electronic device comprising the housing according to claim 14, wherein at least one semiconductor chip is arranged in the plastics housing part.

* * * * *